(12) United States Patent
Milanesi

(10) Patent No.: US 8,022,945 B2
(45) Date of Patent: Sep. 20, 2011

(54) OPERATIONAL AMPLIFIER WITH CONSTANT OFFSET AND APPARATUS COMPRISING SUCH AS OPERATIONAL AMPLIFIER

(75) Inventor: Andrea Milanesi, Zürich (CH)

(73) Assignee: NXP B.V., Eindhoven (NL)

( * ) Notice: Subject to any disclaimer, the term of this patent is extended or adjusted under 35 U.S.C. 154(b) by 1210 days.

(21) Appl. No.: 10/563,995

(22) PCT Filed: Jun. 30, 2004

(86) PCT No.: PCT/IB2004/051064
§ 371 (c)(1),
(2), (4) Date: Jan. 9, 2006

(87) PCT Pub. No.: WO2005/006544
PCT Pub. Date: Jan. 20, 2005

(65) Prior Publication Data
US 2006/0279509 A1    Dec. 14, 2006

(30) Foreign Application Priority Data

Jul. 10, 2003   (EP) .................................. 03102073

(51) Int. Cl.
*G06F 3/038* (2006.01)
(52) U.S. Cl. ........................................ 345/204; 330/252
(58) Field of Classification Search .................. 345/204, 345/87–100; 330/252–311; 327/408–413
See application file for complete search history.

(56) References Cited

U.S. PATENT DOCUMENTS

| | | | | |
|---|---|---|---|---|
| 4,392,112 A * | 7/1983 | Schade, Jr. | | 330/252 |
| 4,555,673 A * | 11/1985 | Huijsing et al. | | 330/258 |
| 5,208,552 A * | 5/1993 | Ryat | | 330/253 |
| 5,384,548 A * | 1/1995 | Sakurai et al. | | 330/253 |
| 5,734,297 A * | 3/1998 | Huijsing et al. | | 330/253 |
| 5,867,138 A | 2/1999 | Moon | | |
| 6,040,732 A * | 3/2000 | Brokaw | | 327/408 |
| 7,135,921 B2 | 11/2006 | Tsuchi | | |
| 7,777,568 B2 * | 8/2010 | Lim | | 330/253 |
| 2001/0004255 A1 * | 6/2001 | Nishimura | | 345/204 |
| 2002/0008684 A1 * | 1/2002 | Udo et al. | | 345/89 |
| 2002/0089485 A1 * | 7/2002 | Youn | | 345/99 |

(Continued)

FOREIGN PATENT DOCUMENTS

CN    1 141 468 A    1/1997

(Continued)

OTHER PUBLICATIONS

Klaas-Jan De Langer et al: "Compact Low-Voltage Power-Efficient Operational Amplifier Cells for VLSI"; IEEE Journal of Solid-State Circuits; vol. 33, No. 10; Oct. 1998; pp. 1482-1496.

(Continued)

*Primary Examiner* — Kevin Nguyen
*Assistant Examiner* — Liliana Cerullo

(57) ABSTRACT

Apparatus (80) comprising an input stage (61) with an NMOS transistor doublet having a first differential input for receiving input signals, and a PMOS transistor doublet having a second differential input for receiving input signals. The apparatus (80) further comprises switching means for receiving and selectively directing analog input signals either to the first differential input or to the second differential input. The means are controlled by a switching signal ($\phi,\bar{\phi}$) in a manner to keep the ratio of the transconductance of the NMOS transistor doublet and the transconductance of the PMOS transistor doublet constant.

20 Claims, 7 Drawing Sheets

U.S. PATENT DOCUMENTS

2002/0171613 A1* 11/2002 Goto et al. ............... 345/87
2002/0196247 A1* 12/2002 Miyazawa et al. ......... 345/211
2003/0160749 A1* 8/2003 Tsuchi .................... 345/87

FOREIGN PATENT DOCUMENTS

| CN | 1 383 262 A | 12/2002 |
|---|---|---|
| JP | 1999-506596 A | 6/1999 |
| JP | 2001-144558 A | 5/2001 |
| JP | 2002-351406 A | 12/2002 |
| JP | 2003-249826 A | 9/2003 |

OTHER PUBLICATIONS

Opris, et al. "A Rail-to-Rail Ping-Pong Of-Amp", IEEE J. of Solid-State Circuits, vol. 31, No. 9, pp. 1320-1324 (Sep. 1996).

* cited by examiner

US 8,022,945 B2

OPERATIONAL AMPLIFIER WITH CONSTANT OFFSET AND APPARATUS COMPRISING SUCH AS OPERATIONAL AMPLIFIER

The present invention concerns operational amplifiers and systems, such as LCD source drivers, based thereon.

The liquid crystals (LC) of a liquid crystal display (LCD) are typically driven with an alternating driving voltage, referred to as LC voltage, whose peak to peak voltage is defined by a transmission-voltage curve 10, as depicted in FIG. 1. In this Figure, the transmittance vs. the LC voltage is depicted. The alternating LC voltage is used to avoid degeneration of the LCs. In order to obtain a desired grey level, the distance between the respective positive voltage peak 11 and the negative voltage peak 12 is to be kept at a constant voltage level referred to as VCOM. In FIG. 1, the voltages applied on the LC are represented by the two arrows 11 and 12, the first arrow 11 pointing in the positive LC voltage direction and the second arrow 12 pointing in the negative LC voltage direction.

The LC voltage across the LC is subject to two different errors: differential errors which may give as a result visible dim lines, common mode errors, which usually result in flickering.

FIG. 2 shows the worst cases of four "pairs" of LC voltages that can occur in the source driver of an LCD, for a given offset. The output N has a positive differential error of 2*offset since both peaks 13 and 14 reach the respective maximum offset 17, and the output N+1 has a negative differential error of −2*offset since both peaks 15 and 16 reach the respective minimum offset 18. The total differential error between two adjacent LC lines N and N+1, if the first line N is driven with $Y_N$ and the second line N+1 is driven with $Y_{N+1}$ is:

$$Y_{N\_DIFF\_ERR} - Y_{N+1\_DIFF\_ERR} = 4*\text{offset} \quad (1)$$

For these two outputs YN and YN+1 the common voltage error is 0, because the average of the driving voltages 13 through 16 is equal to VCOM.

The outputs N+2 and N+3 do not have any differential error. The difference of the driving voltages 21, 22 applied on the LC is equal to the difference of the two target voltages, they have, however, a common voltage error 25. The difference of the driving voltages 23, 24 is equal to the difference of the two target voltages, they have, however, a common voltage error 26. The output N+2 has a positive common error 25 of offset, and the output N+3 has a negative differential error 26 of −offset. The difference of the two common voltage errors 25 and 26 is:

$$Y_{N\_COMM\_ERR} - Y_{N+1\_COMM\_ERR} = 2*\text{offset} \quad (2)$$

For a given offset the maximum differential error voltage is twice the maximum common mode error.

The LC are far more sensible to differential voltages than to common mode voltages, so there is a need for a driving system that allows to provide precise differential LC voltages.

Liquid Crystals (LC) need to be driven with an alternate LC voltage, as explained above, that should have a low differential mode error. A very simple method to reduce differential mode errors is to drive the LC on both P and N sides with the same buffer. In an ideal case the buffer will have an offset, but this will be more or less constant along the output range. The voltage drop ΔV across the LC would be:

$$\Delta V = V_{gammaP} V_{Offset} - (V_{gammaN} + V_{Offset}) = V_{gammaP} - V_{gammaN} \quad (3)$$

As one can derive from equation (3), one loses the dependence on the buffer offset, since the term $+V_{Offset} - V_{Offset}$ is equal to zero. This strategy has been implemented on 6 bit drivers with rail-to-rail operational amplifiers. The drawback of this approach is that close to the rails one of two input doublets of the source driver's input stage switches off, with the result of an even big differential error. On a 6 bit driver, the bit widths close to the rail are quite big. If the extra error does not exceed ⅓ of the bit width, on the LCD screen no visible effect will be seen.

The situation changes drastically with an 8 bit device. The bit width, in any part of the gamma curve (see FIG. 1), will be 4 times smaller. The precision of a traditional rail-to-rail operational amplifier is not enough for such an 8 bit device.

A standard rail-to-rail amplifier 30 is depicted in FIG. 3. This Figure shows a common rail-to-rail input stage 30, composed by two transistor doublets. The first transistor doublet comprises two PMOS transistors M3, M4, and the second transistor doublet comprises two NMOS transistors M1, M2. The input stage 31 has a differential input with negative and positive input terminals 32, 33. The outputs of the two transistor doublets are connected to the second stage 34 of the rail-to-rail amplifier 30. On the right hand side of FIG. 3, the dynamic range of the two transistor doublets is illustrated. As one can see, only in the middle range 35 both transistor doublets are operable. The saturation voltage Vsat indicated is the voltage drop needed by a current supply to work properly. $Vgs_{NMOS}$ and $Vgs_{PMOS}$ are the gate source voltages of the NMOS and PMOS transistors.

The total offset present in the rail-to-rail amplifier 30, when all the devices are operable, is:

$$Voff_{TOT} = Voff_P + Voff_N + \frac{1}{2}K \quad (4)$$

Where K is the offset contribution of the second stage 34 when one of the two transistor doublets is switched off. $Gm_{1ST\_STAGE} = Gm_{NMOS} + Gm_{PMOS}$ and $Gm_{NMOS} = Gm_{PMOS}$ is also considered in this equation (4). In this equation and in subsequent equations, the suffix N or NMOS refers to the NMOS transistors and the suffix P or PMOS refers to the PMOS transistors.

If one of the complementary transistor doublets of the input stage 31 switches off, the contribution to the offset of the 2nd stage 34 doubles, because the input transconductance $Gm_{1ST\_STAGE}$ halves. When one of the transistor doublets of the input stage 31 switches off and the $Gm_{NMOS} \neq Gm_{PMOS}$, if the offset contribution of the second stage 34 when the PMOS transistors M1, M2 switch off is K, when the NMOS transistors M3, M4 switch off, the total offset is:

$$Voff_{TOT} = Voff_P + K\frac{Gm_N}{Gm_P} \quad (5)$$

One now can calculate the maximum differential error Δerr:

$$\Delta err = Voff_P + K\frac{Gm_N}{Gm_P} - (Voff_N + K) = Voff_P - Voff_N + K\left(\frac{Gm_N}{Gm_P} - 1\right) \quad (6)$$

When both input MOS transistors work, the differential error is 0 if: $Gm_N = Gm_P$, $Voff_N = Voff_P$. It is maximum when $Voff_{NMOS} = -Voff_{PMOS}$, $Gm_N \neq Gm_P$, and it is:

$$\Delta err_{MAX} = 2Voff_P + K\left|\frac{Gm_N}{Gm_P} - 1\right| \quad (7)$$

Prior art source drivers, as the one described in connection with FIG. 3, are not designed to provided the required precise differential LC voltages. Conventional amplifiers used in source drivers, for instance, do not provide for a constant offset over the whole input range.

It is thus an objective of the present invention to improve amplifiers so that they have a constant offset over the whole input range.

It is another objective of the present invention to provide an amplifier that is better suited for being used in liquid crystal displays than conventional amplifiers.

In particular, the present invention is directed to an LCD source driver that substantially obviates the problems due to limitations and disadvantages of the related art.

These disadvantages of known systems, as described above, are reduced or removed with the invention as described and claimed herein.

An apparatus in accordance with the present invention is claimed in claim 1.

Various advantageous embodiments are claimed in claims 2 through 9.

Another apparatus in accordance with the present invention is claimed in claim 10.

Various advantageous apparatus are claimed in claims 11 through 13.

Additional features and advantages of the invention will be set forth in the description that follows, and in part will be apparent from the description.

For a more complete description of the present invention and for further objects and advantages thereof, reference is made to the following description, taken in conjunction with the accompanying drawings, in which.

Before addressing detailed embodiments of the present invention, the typical block diagram of an LCD system is addressed.

Figure 1:
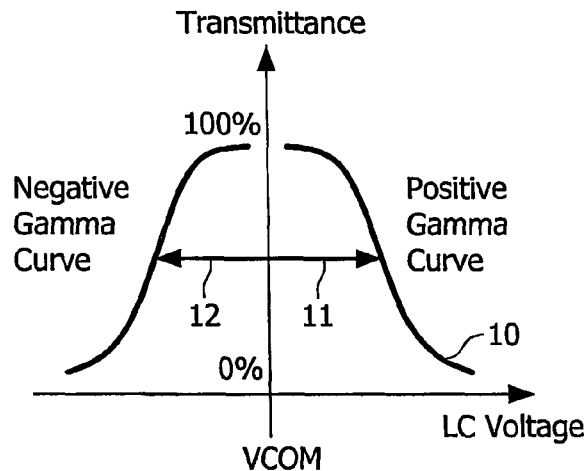
FIG. 1 shows a typical Transmission Voltage Curve, as used in LCD displays.
Figure 2:
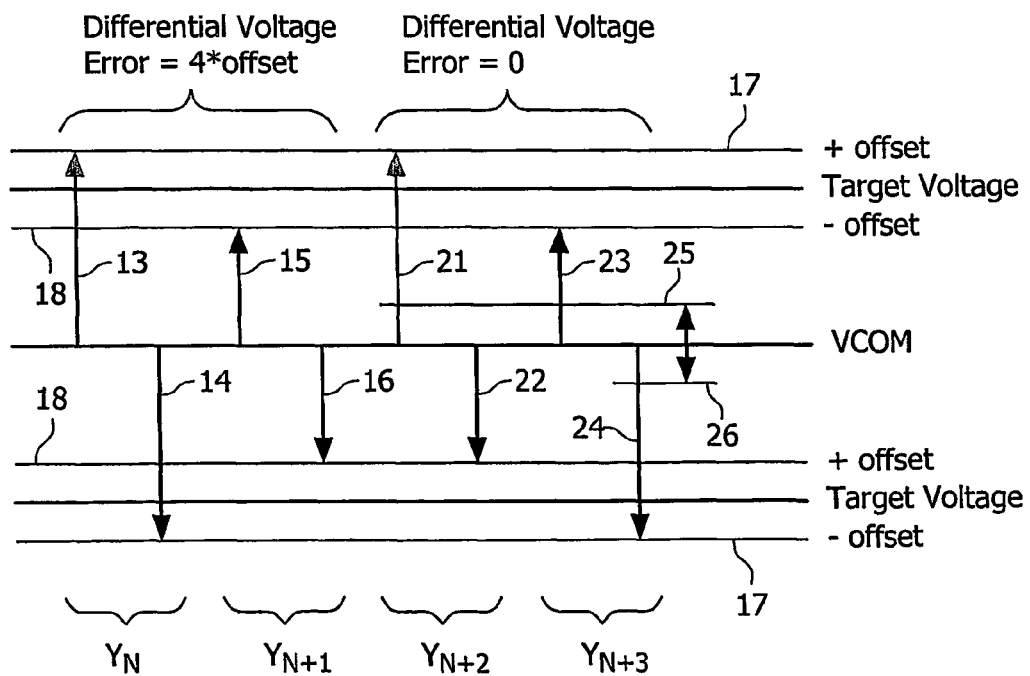
FIG. 2 shows the four driving voltages worst cases that can be present in a Source Driver of an LCD display.
Figure 3:
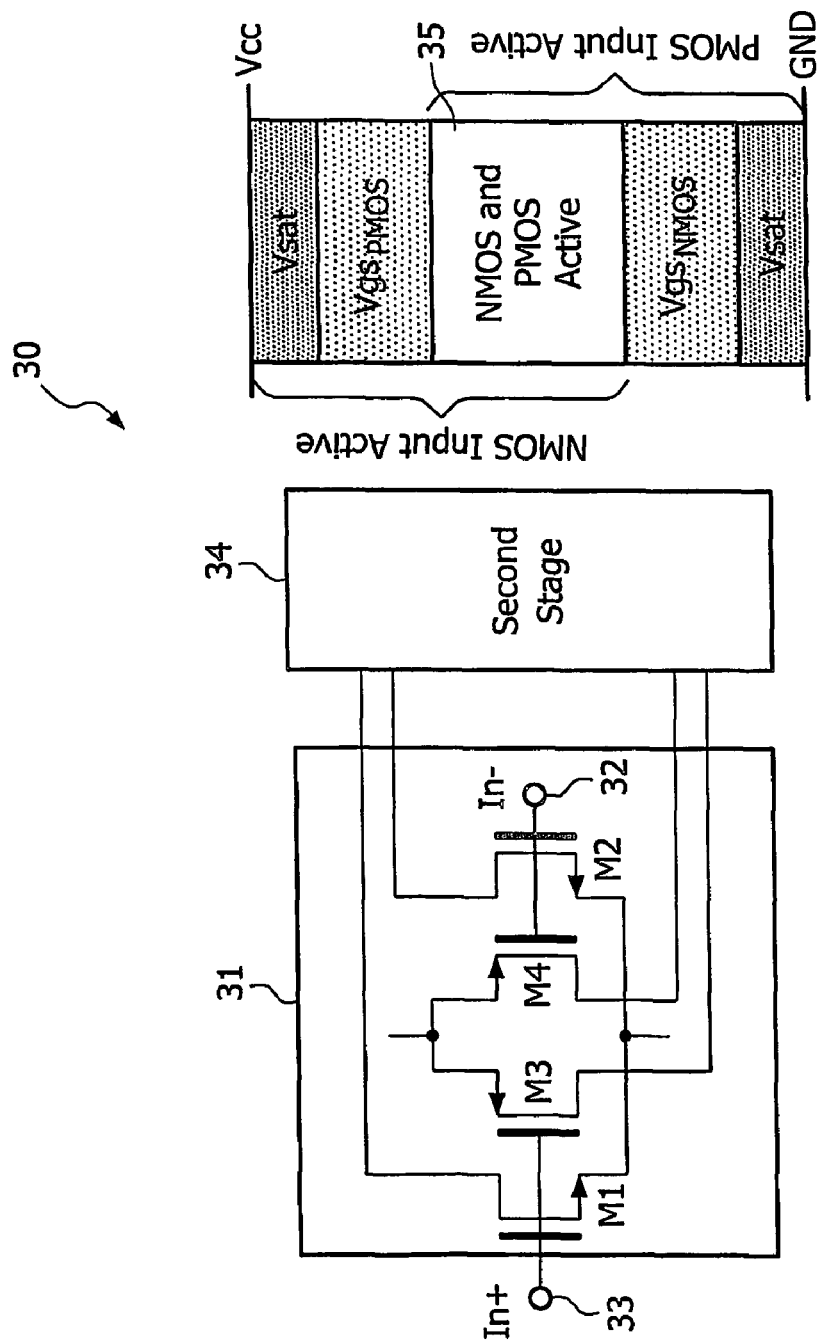
FIG. 3 is a block diagram of a conventional rail-to-rail input stage, as used in LCD displays.
Figure 4:
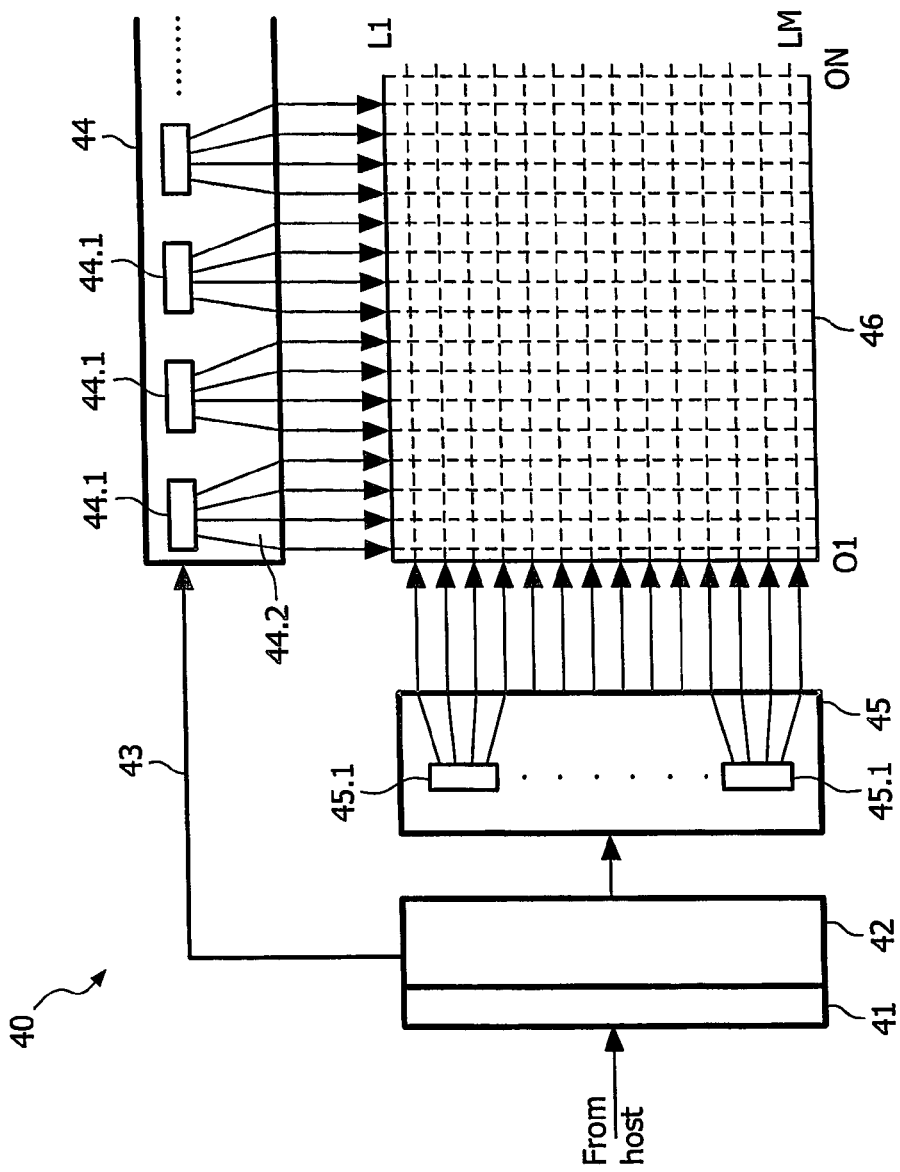
FIG. 4 is a block diagram of a conventional LCD display.

FIG. 4 shows a typical block diagram of an LCD system. Low Voltage Differential Signaling (LVDS) is used as the interface between a host computer (not illustrated in FIG. 4) and a panel module 40. An LVDS receiver function 41 is typically integrated into a panel timing controller 42. A reduced swing differential signaling (RSDS) bus 43 is located between the panel timing controller 42 (TCON) serving as transmitting circuit and a source driver bank 44 serving as receiving circuit. RSDS is a trademark of National Semiconductor Corporation. The RSDS bus 43 is typically a differential bus that is eight pairs wide plus a clock pair and it may have a multidrop bus configuration. The source driver bank 44 comprises a plurality of RSDS source drivers 44.1. Typically, each source driver 44.1 of the source driver bank 44 serves n column electrodes (with n=384 or 480, for example) of the display panel 46 by providing analog output signals. In the present example, each source driver 44.1 serves n=4 column electrodes only. There is a gate driver array 45 comprising an array of gate drivers 45.1. Several of the rows of the panel 46 are driven by any of these gate drivers 45.1. The gate drivers 45.1 are activated sequentially to turn on one row of pixels at a time, allowing analog voltages driven onto the columns to be applied to each row of pixels in series. The panel 46 may be a TFT-LCD panel with 640 pixels width and 480 lines (or rows) of pixels, for example. The source drivers 44.1 have interfaces using a differential clock signal (CLK+ and CLK−) received via the RSDS bus 43 to strobe the video data.

A TFT-LCD source driver 44.1 is a circuit that supplies LC voltages to LCD pixel columns. The function of a TFT-LCD source driver 44.1 is explained referring to FIG. 4. Digital video signals are inputted to the TFT-LCD source driver 44.1. In an active matrix type liquid crystal display panel 46 constituting a display apparatus 40, source lines O1 to ON and gate lines L1 to LM are formed in an N×M matrix. At each intersection of the lines, a thin film transistor is disposed. The thin film transistors are not shown in FIG. 4. Voltages at the source lines O1 to ON are selectively supplied to pixel electrodes P via the thin film transistors. A gate driver 45.1 formed by a semiconductor integrated circuit delivers gate signals to the gate lines L1 to LM. In a horizontal scanning period, the source drivers 44.1 supply an alternating LC voltage (also referred to as reference voltage), which is generated in accordance with video data received via the differential bus 43. In other words, a source driver is a circuit that supplies video signals to an LCD pixel array.

According to the present invention, circuits are provided that have a constant offset over the whole range of the differential input signal.

In the following sections, an operational amplifier is addressed which has a rail-to-rail input stage and, in accordance with the present invention, a constant offset on the whole input range. The input stage comprises two transistor doublets, as in prior art systems. According to the present invention, for a given input signal only the transistor doublet needed is used. If one has an input signal close to ground, one uses only a PMOS transistor doublet and if one has an input signal close to the supply voltage VCC, one uses only an NMOS transistor doublet. According to the present invention, the unused (idle) transistor doublet is maintained in an active state. The purpose of this is to keep its transconductance (Gm) of the idle transistor doublet always constant and equal in value to the transconductance of the used transistor doublet. For a source driver, a possible solution in accordance with the present invention, is the following: for positive gamma data the NMOS transistor doublet is used and for negative gamma the PMOS transistor doublet is used. Using the input stage in this way, the offset stays constant only if the transconductance of the NMOS transistor doublet and the PMOS transistor doublet are the same, that is $Gm_{NMOS} = Gm_{PMOS}$.

Figure 5A:
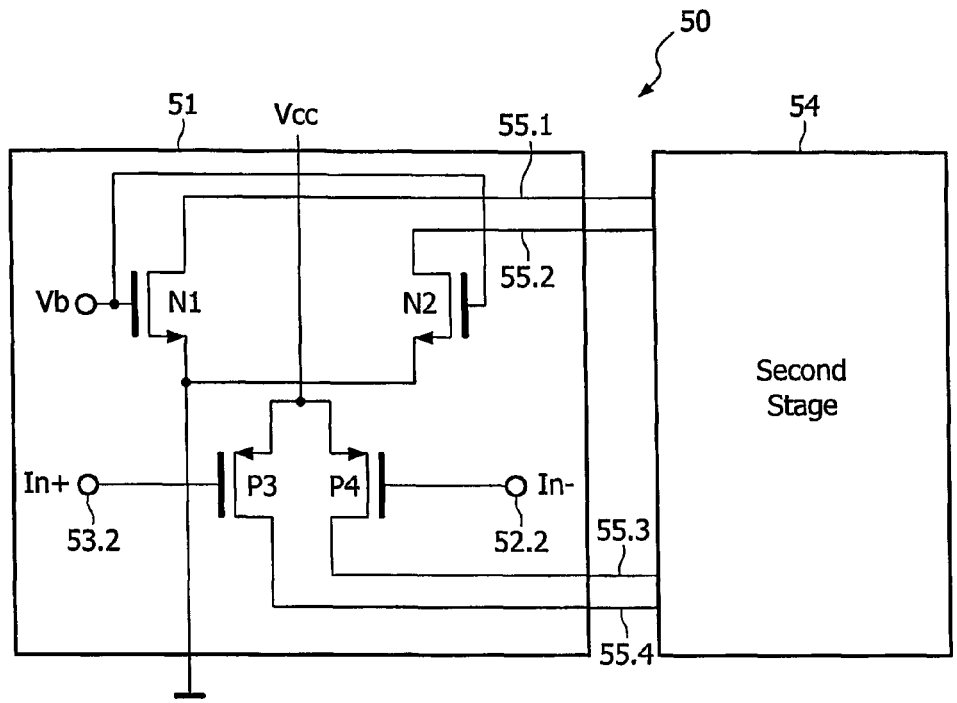
FIG. 5a is a schematic block diagram of a rail-to-rail input stage, according to the present invention, where a PMOS transistor doublet is used.
Figure 5B:
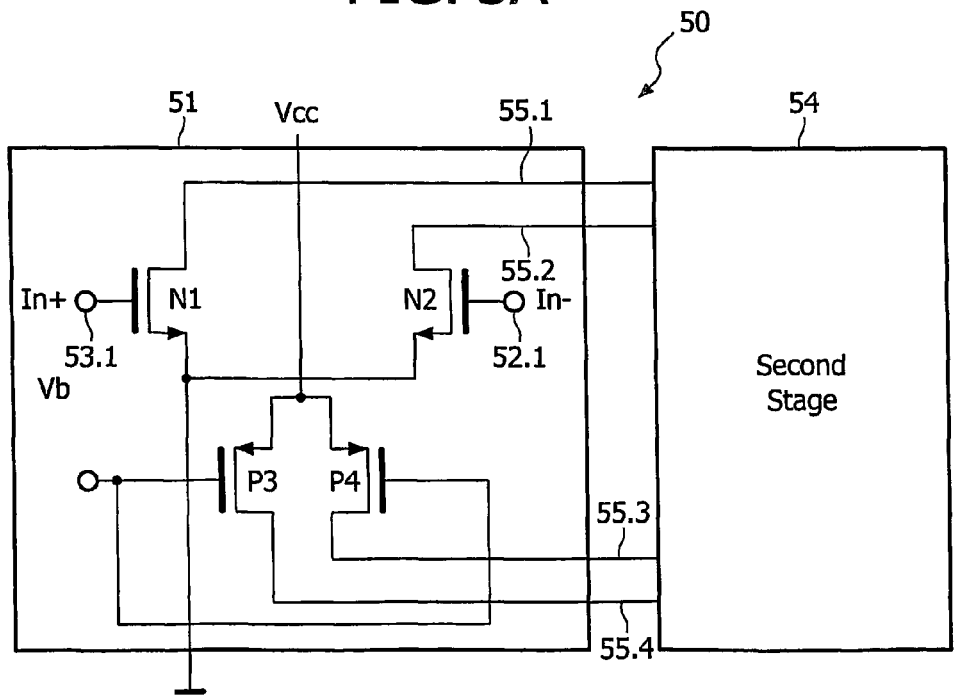
FIG. 5b is a schematic block diagram of a rail-to-rail input stage, according to the present invention, where an NMOS transistor doublet is used.

FIGS. 5A and 5B illustrate how to obtain a constant offset with a rail-to-rail input stage 50.

In accordance with CMOS technology, the apparatus comprises a plurality of MOS transistors of both the NMOS and PMOS type. In the drawings and in the description, the NMOS transistors are designated with the prefix N and the PMOS transistors are designated with the prefix P.

A first apparatus in accordance with the present invention is depicted in FIGS. 5A and 5B. In these Figures, an input stage 50 of a source driver is depicted. The input stage 50 comprises an NMOS transistor doublet N1, N2 with a first differential input 52.1, 53.1 for receiving analog input signals In+, In−. The input stage 50 furthermore comprises a PMOS transistor doublet P3, P4 with a second differential input 52.2, 53.2 for receiving input signals In+, In−. In order to be able to direct the input signals In+, In− either to the first transistor doublet N1, N2 or to the second doublet P3, P4, switching means are employed that selectively direct the analog input signal In+, In− either to the first differential input 52.1, 53.1 or to the second differential input 52.2, 53.2. The switching function is controlled by a switching signal, preferably a digital switching signal. For sake of simplicity, the switching means are not depicted in FIGS. 5A and 5B. More details about the switching means will be given in connection with FIG. 6.

FIG. 5A shows a situation where the differential input signal In+, In− is directed to the PMOS transistor doublet P3, P4 and FIG. 5B shows a situation where the differential input signal In+, In− is directed to the NMOS transistor doublet N1, N2. The drains 55.1 through 55.4 of the four transistors N1, N2, P3, P4 are connected to a second stage 54. The second stage 54 typically comprises an amplifier. In order to ensure that the transconductance $Gm_{NMOS}$ of the NMOS transistor doublet and the transconductance $Gm_{PMOS}$ of the PMOS transistor doublet are the same, no matter whether positive gamma data or negative gamma are applied to the differential inputs 52.1, 52.2, 53.1, 53.2, the idle transistor doublet, i.e. the one transistor doublet not being used, is kept active. In other words, while the first transistor doublet processes the input signal, the other transistor doublet's transconductance Gm is kept constant.

The precision of any amplifier using the invention depends on how well the $Gm_{NMOS}$ and $Gm_{PMOS}$ of the transistor doublets N1, N2 and P3, P4 are matched. In the following it is described which parameters can influence the Gm precision during the process diffusion. The Gm can be calculated with the following formula:

$$Gm = \sqrt{2\mu C_{OX} \frac{W}{L} I_D} \quad (8)$$

The ratio between the two Gm is:

$$\frac{Gm_{PMOS}}{Gm_{NMOS}} = \frac{\sqrt{2\mu_P C_{OX} \frac{W_P}{L_P} I_D}}{\sqrt{2\mu_N C_{OX} \frac{W_N}{L_N} I_D}} = \frac{\sqrt{\mu_P \frac{W_P}{L_P}}}{\sqrt{\mu_N \frac{W_N}{L_N}}} = \frac{\sqrt{\mu_P}}{\sqrt{\mu_N}} \frac{\sqrt{\frac{W_P}{L_P}}}{\sqrt{\frac{W_N}{L_N}}} \quad (10)$$

$C_{OX}$ and $I_D$ are the same. If one supposes for the sake of simplicity that the geometric errors on W and L of the transistors are small (usually the input transistors are quite large), the main source of error is the process spread on the mobility of the NMOS and PMOS transistors, that are more or less independent from each other.

The mobility can change +/−15% with respect to the typical value. Hence the previous ratio will be:

$$0.86 = \sqrt{\frac{0.85}{1.15}} \leq \frac{Gm_{PMOS}}{Gm_{NMOS}} \leq \sqrt{\frac{1.15}{0.85}} = 1.16 \quad (11)$$

In case the Gm is not identical, the offset does not stay constant. One can calculate how big the contributions of the first stage 51 and the second stage 54 are. One can start calculating the contribution to the offset of the first stage 51. For a positive gamma curve, the offset will be:

$$Voff_{1ST\_P} = Voff_N + Voff_P \frac{Gm_{PMOS}}{Gm_{NMOS}} \quad (12)$$

For a negative gamma curve, the offset will be:

$$Voff_{1ST\_N} = Voff_P + Voff_N \frac{Gm_{NMOS}}{Gm_{PMOS}} \quad (13)$$

The contribution to the offset of the second stage 54, if for a positive gamma curve is $Voff_{2ND\_P}=K$ for the negative gamma curve is:

$$Voff_{2ND\_N} = K \frac{Gm_{PMOS}}{Gm_{NMOS}} \quad (14)$$

The differential error is the difference between the offset when a value of the positive gamma curve is driven, and the offset when a value of the negative gamma curve is driven:

$$\Delta err = Voff_{1ST\_N} - Voff_{2ND\_N} - (Voff_{1ST\_P} - Voff_{2ND\_P}) \quad (15)$$

If one inserts in this expression (15) what was calculated before in equation (14), one obtains:

$$\Delta err = \quad (16)$$
$$Voff_P\left(1 - \frac{Gm_{PMOS}}{Gm_{NMOS}}\right) + Voff_N\left(\frac{Gm_{NMOS}}{Gm_{PMOS}} - 1\right) + K\left(\frac{Gm_{PMOS}}{Gm_{NMOS}} - 1\right)$$

$$\text{If } \left|\frac{Gm_{NMOS}}{Gm_{PMOS}} - 1\right| << 1, \text{ then } \left|\frac{Gm_{NMOS}}{Gm_{PMOS}} - 1\right| \cong \left|1 - \frac{Gm_{PMOS}}{Gm_{NMOS}}\right|,$$

so the previous equation (16) becomes:

$$\Delta err = \left|1 - \frac{Gm_{PMOS}}{Gm_{NMOS}}\right|(Voff_P + Voff_N + K) = \left|1 - \frac{Gm_{PMOS}}{Gm_{NMOS}}\right| Voff_{TOT} \quad (17)$$

It results that the maximum differential error will be about 15% of the maximum offset of the operational amplifier of the second stage 54. There is another advantage, not obvious either. None takes a closer look at the final expression (17) of the differential error:

$$\Delta err = \underbrace{\left|1 - \frac{Gm_P}{Gm_N}\right|}_{MOBILITY} \underbrace{Voff_{TOT}}_{OFFSET} \quad (18)$$

The expression (18) is composed of two factors, one dependent mainly on the mobility, the other on the random offset, hence mostly on impurities present on the surface and inside the oxide of the transistors of the two transistor doublets. These two factors are statistically independent from each other, hence the occurrence of the error is the product of the probability of the single event.

With a practical example it quite easy to explain this. One has seen that $$0.86 \leq \frac{Gm_P}{Gm_N} \leq 1.16 \quad (19)$$

Based on the hypothesis that the maximum total offset is $V_{offTOT}=30$ mV, and that the values given are $4\sigma$ values, the maximum differential error will be:

$$\Delta err = \pm 0.15 \cdot 30 = \pm 4.5 \text{ mV} \quad (20)$$

Because the two factors are independent from each other, the occurrence of this event will be the product of the probability, hence it is an $8\sigma$ value. This contributes to increase the yield of an input stage that is present many times in current and future ICs.

From the above equations one can derive that the differential error of a system in accordance with the present invention, as expressed in equation (18), is remarkably smaller than the maximum differential error of a prior art system, as expressed in equation (7).

Figure 6:
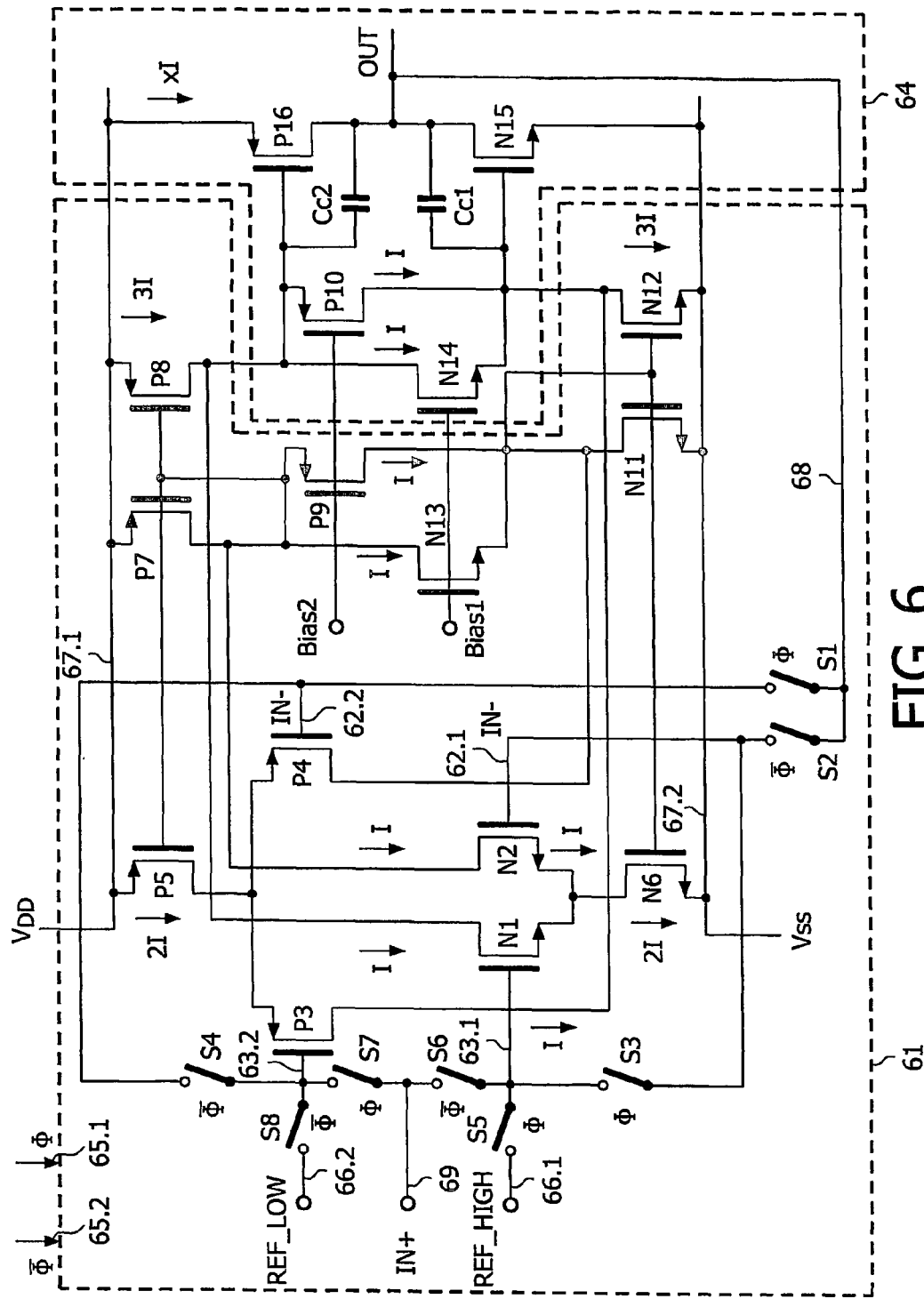
FIG. 6 is a schematic block diagram of another embodiment, according to the present invention.

Another embodiment is depicted in FIG. 6. In this figure, an apparatus is shown that comprises a folded cascode rail-to-rail input stage 61 and a second stage 64, comprising a rail-to-rail output stage amplifier. For a complete description of the output stage amplifier in FIG. 6, please refer to the following reference: "Compact Low-Voltage Power-Efficient Operational Amplifier Cells for VLSI", de Langen K. J. et al., Solid-State Circuits, IEEE Journal of, Vol. 29, Issue: 10 Oct. 1998, pp. 1482-1496.

The input stage 61 comprises an NMOS transistor doublet N1, N2 with a first differential input 62.1, 63.1 for receiving input signals IN+, IN−. The input stage 61 furthermore comprises a PMOS transistor doublet P3, P4 with a second differential input 62.2, 63.2 for receiving input signals IN+, IN−. The transistors P7, P8, P9 and N11, N12, N13 complete the folded cascode input stage 61. The transistor pair P9, N13 acts as a voltage source that fixes the bias current in the folded branches (P7 to N11 and P8 to N12) and through P5 and P6 in the two transistor doublets P3, P4, and N1, N2. The second stage 64 is a class AB output stage composed by the transistors P10, N14, P16, and N15. The transistors P10 and N14 serve as voltage level shifter for biasing properly the gates of the two output transistors P16 and N15, in order to control their steady state bias current.

In order to be able to direct the analog input signals IN+, IN− either to the first transistor doublet N1, N2 or to the second doublet P3, P4, switching means are employed that selectively direct the analog input signal either to the first differential input 62.1, 63.1 or to the second differential input 62.2, 63.2. The switching function is controlled by a switching signal, preferably a digital switching signal, applied to the inputs 65.1, 65.2. In the present example, the switching signal has two states, either $\Phi$ or $\overline{\Phi}$. The switching means comprise eight switches S1 through S8. The switches S1 through S8 may be realized by transistors. The switches S1, S3, S5 and S7 close if the switching signal $\Phi$ is applied while the switches S2, S4, S6 and S8 remain open. If the signal $\overline{\Phi}$ is applied to the switches S2, S4, S6 and S8, these switches are closed and the switches S1, S3, S5 and S7 are open. That is, if $\Phi$ is active, the PMOS transistor doublet P3, P4 processes the input signals IN+ and IN−. At the same time, the NMOS transistor doublet N1, N2 remains active since the first differential inputs 63.1, 62.1 are connected to a reference voltage REF_HIGH, that is made available at a node 66.1. If $\overline{\Phi}$ is active, the NMOS transistor doublet N1, N2 process the input signals IN+ and IN−. At the same time, the PMOS transistor doublet P3, P4 remain active since the second differential inputs 63.2, 62.2 are connected to a reference voltage REF_LOW. The reference voltage REF_LOW is made available at a node 66.2.

The positive supply rail may be $V_{DD}$, for example, and the negative supply rail may be $V_{SS}$, for example. The output OUT of the apparatus is connected via a feedback loop 68 and switches S1 and S2 back to the negative differential input terminals 61.2, 62.2, depending on the phase $\Phi$ and $\overline{\Phi}$.

Figure 7:
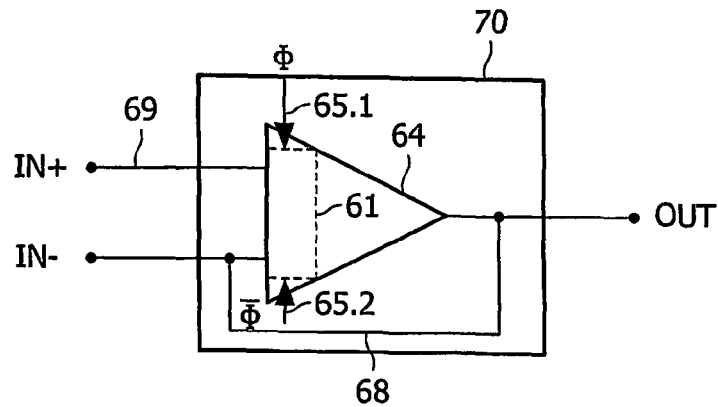
FIG. 7 is a schematic block diagram of the embodiment illustrated in FIG. 6.

The apparatus 70 of FIG. 6 can be simplified, as illustrated in FIG. 7. It comprises a differential input IN+, IN− and an output OUT. There is a feedback loop 68 between the output OUT and the negative input IN−. The input stage 61 is depicted as rectangular box inside the amplifier 64. Also visible in this Figure are the phase inputs 65.1, 65.2. The control signal applied to these phase inputs 65.1, 65.2 control the operation of the transistors doublets of the input stage 61.

Figure 8:
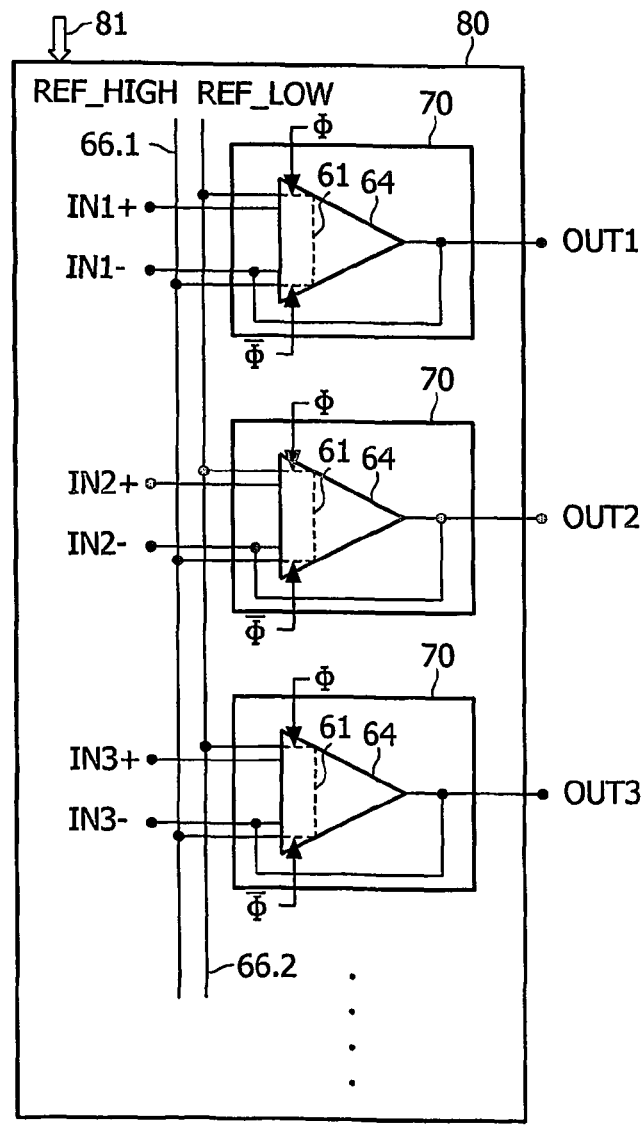
FIG. 8 is a schematic block diagram of a part of a source driver, according to the present invention.

Part of a source driver bank 80 with n apparatus 70 is schematically illustrated in FIG. 8. The differential input signals IN1+, IN2+, IN3+ through INn+ and IN1−, IN2−, IP3− through INn− are fed to the differential inputs of the n apparatus 70. The differential input signals are received via a bus 81. This bus 81 may be identical to the bus 43 in FIG. 4, for instance. These differential input signals are used to control the respective columns of an LCD screen. Each apparatus 70 comprises an amplifier 64, depicted as triangle, and an input stage 61, depicted as rectangular box inside the triangle. The input stage 61 has two transistor doublets, not visible in FIG. 8, which alternatively process the differential input signals. Control signals $\Phi$ and $\overline{\Phi}$ are applied to the respective terminals of the apparatus 70, as illustrated in FIG. 8. Depending on the state of these control signals, the differential input signals are either directed to an NMOS transistor doublet or to a PMOS transistor doublet of the input stage. In order to keep the idle transistor doublet active, two reference voltages REF_HIGH and REF_LOW are provided via two supply lines 66.1, 66.2 to the input stages 61.

Figure 9:
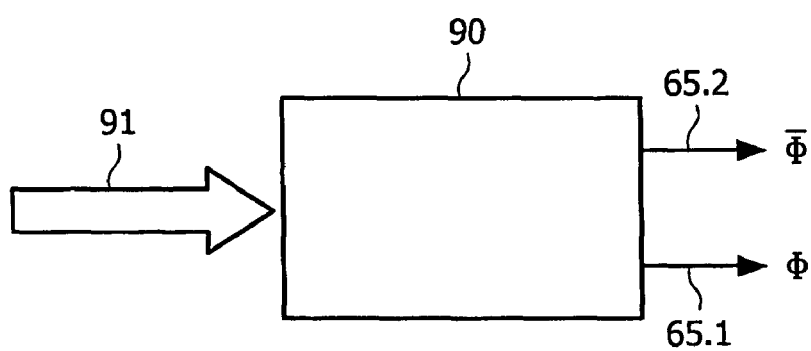
FIG. 9 is a schematic block diagram of a control signal generator, according to the present invention.

An apparatus in accordance with the present invention may comprise a control signal generator 90, as illustrated in FIG. 9. The control signal generator 90 receives data via a bus 91. The data are sent by a display controller, for example. The bus 91 may be identical to the bus 43 in FIG. 4. The apparatus 90 comprises a logic circuitry to generate the two phase signals $\Phi$ and $\overline{\Phi}$. These phase signals are fed to the n apparatus 70.

As explained above, and as can be derived from the Figures, the invention provides for an apparatus where none of the transistor doublets of the input stage are allowed to switch off. While the differential input signal is being processed by one of the two transistor doublets, the other transistor doublet, referred to as idle transistor doublet, is kept active. The idle transistor doublet is temporarily connected to the respective reference voltage (either HIGH_REF or LOW_REF) and the other transistor doublet is temporarily connected to the differential input.

The present invention allows to provide a constant offset over the whole input/output range. An apparatus, according to the present invention, provides a high precision differential voltage.

An apparatus, according to the present invention, is well suited for being used in thin film transistor liquid crystal display (TFT-LCD) source drivers, for example, since these drivers require a high precision differential voltage in order to drive the flat display to avoid visual defects or artifacts.

The inventive circuitry is well suited for use in source driver for display applications with present (VGA and UXGA) and future resolutions.

It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable subcombination.

In the drawings and specification there has been set forth preferred embodiments of the invention and, although specific terms are used, the description thus given uses terminology in a generic and descriptive sense only and not for purposes of limitation.

The invention claimed is:

1. An apparatus comprising:
an input stage with
    an NMOS transistor doublet having a first differential input for receiving input signals,
    a PMOS transistor doublet having a second differential input for receiving input signals, and
    a plurality of switches configured to couple analog input signals to the first differential input and couple the second differential input to a first reference voltage in response to a switching signal being a first value, and configured to couple the analog input signals to the second differential input and couple the first differential input to a second reference voltage in response to the switching signal being a second value, wherein the coupling of analog inputs signals and the first and second reference voltages causes the ratio of the transconductance of the NMOS transistor doublet and the transconductance of the PMOS transistor doublet to remain constant over the entire input range.

2. The apparatus of claim 1, wherein the plurality of switches direct the analog input signals to said first differential input if the input signals have positive gamma data and to said second differential input if the input signals have negative gamma data.

3. The apparatus of claim 1, wherein the NMOS transistor doublet comprises two NMOS transistors, each having a gate, whereby the gate of the first of the two NMOS transistors is connectable to a first input node via a first switch of the plurality of switches and the gate of the second of the two NMOS transistors is connectable to a second input node via a second switch of the plurality of switches, the PMOS transistor doublet comprises two PMOS transistors, each having a gate, whereby the gate of the first of the two PMOS transistors is connectable to the first input node via a third switch of the plurality of switches and the gate of the second of the two PMOS transistors is connectable to the second input node via a fourth switch of the plurality of switches.

4. The apparatus of claim 3, wherein the gate of the first of the two NMOS transistors is connectable, via a fifth switch of the plurality of switches, to a first reference node being biased with the first reference voltage, and the gate of the second of the two NMOS transistors is connectable to the first reference node via a sixth switch of the plurality of switches, and the gate of the first of the two PMOS transistors is connectable, via a seventh switch of the plurality of switches, to a second reference node being biased with the second reference voltage and the gate of the second of the two PMOS transistors is connectable to the second reference node via an eighth switch of the plurality of switches.

5. The apparatus of claim 1, wherein the input stage is a rail-to-rail input stage.

6. The apparatus of claim 4, wherein the input stage is configured to keep the NMOS doublet active when the analog input signals are coupled to the second differential input and to keep the PMOS transistor doublet active when the analog input signals are coupled to the first differential input.

7. The apparatus of claim 1, wherein said switching signal is a digital switching signal.

8. The apparatus according to claim 1, wherein transistors serve as the switches.

9. The apparatus of claim 1 wherein the NMOS transistor doublet and the PMOS transistor doublet are part of a folded cascode rail-to-rail input stage and wherein the folded cascode rail-to-rail input stage is connected to a second stage comprising a rail-to-rail output stage amplifier.

10. An apparatus comprising:
a source driver bank with a plurality of input stages, each input stage having
    an NMOS transistor doublet having a first differential input for receiving input signals,
    a PMOS transistor doublet having a second differential input for receiving input signals, and
    a plurality of switches configured and arranged to, in response to a switching signal, direct analog input signals to one of the first and second differential inputs and to connect the other one of the first and second differential inputs to a reference voltage, the directing of the analog signals causing a ratio of the transconductance of the NMOS transistor doublet and the transconductance of the PMOS transistor doublet to remain constant over the entire input range; and
a bus for receiving input signals.

11. The apparatus of claim 10, further comprising a gate driver bank and an LCD panel.

12. The apparatus of claim 10, further comprising a control signal generator for generating the switching signal.

13. The apparatus of claim 10 being part of a panel module.

14. An apparatus comprising
an input stage with an NMOS transistor doublet having a first differential input for receiving input signals, a PMOS transistor doublet having a second differential input for receiving input signals, and a plurality of switches for receiving and selectively directing analog input signals only to one of either said first differential input or said second differential input responsive to a switching signal and for connecting the other one of the first and second differential inputs to a reference voltage responsive to the switching signal, the input stage being configured to keep the ratio of the transconductance of the NMOS transistor doublet and the transconductance of the PMOS transistor doublet constant over the entire input range by operating in either a first mode or a second mode responsive to the switching signal, the NMOS and PMOS transistor doublets each being kept active in each of the modes, the plurality of switches being configured, in the first mode, to direct the analog input signals to the first differential input and to connect a first reference voltage to the second differential input, and the plurality of switches being configured, in the second mode, to direct the analog input signals to the second differential input and to connect a second reference voltage to the first differential input.

15. The apparatus of claim 1, wherein the first differential input is formed by the gates of the NMOS transistor doublet and the second differential input is formed by the gates of the PMOS transistor doublet.

16. The apparatus of claim 1, wherein the plurality of switches are configured to selectively direct input signals to one of the differential inputs, and to connect the other one of the differential inputs to a reference voltage, to keep the transconductance ratios of the NMOS and PMOS transistor doublets constant.

17. The apparatus of claim 1, wherein the input stage is configured to:

couple transistor gates of the NMOS transistor doublet to a high reference voltage when the analog input signals are directed to the second differential input; and couple transistor gates of the PMOS transistor doublet to a low reference voltage when the analog input signals are directed to the first differential input.

18. The apparatus of claim 1, wherein the input stage is configured to:

cause the NMOS transistor doublet to exhibit a constant transconductance when the analog input signals are directed to the second differential input; and cause the NMOS transistor doublet to exhibit a constant transconductance when the analog input signals are directed to the first differential input.

19. The apparatus of claim 1, wherein the reference voltage is a constant voltage.

20. The apparatus of claim 1, wherein the apparatus is configured to exhibit a constant offset over the entire input range.

* * * * *